(12) United States Patent
Sadoughi et al.

(10) Patent No.: US 7,256,087 B1
(45) Date of Patent: Aug. 14, 2007

(54) TECHNIQUES FOR IMPROVING NEGATIVE BIAS TEMPERATURE INSTABILITY (NBTI) LIFETIME OF FIELD EFFECT TRANSISTORS

(75) Inventors: Sharmin Sadoughi, Menlo Park, CA (US); Krishnaswamy Ramkumar, San Jose, CA (US); Ravindra Kapre, San Jose, CA (US); Igor Polishchuk, Fremont, CA (US); Maroun Khoury, Hillsboro, OR (US)

(73) Assignee: Cypress Semiconductor Corporation, San Jose, CA (US)

( * ) Notice: Subject to any disclaimer, the term of this patent is extended or adjusted under 35 U.S.C. 154(b) by 76 days.

(21) Appl. No.: 11/018,422

(22) Filed: Dec. 21, 2004

Related U.S. Application Data (60) Provisional application No. 60/532,135, filed on Dec. 22, 2003.

(51) Int. Cl.
*H01L 21/8238* (2006.01)
(52) U.S. Cl. ............... 438/216; 257/371; 257/E21.632; 438/475

(58) Field of Classification Search ................ 438/475, 438/197
See application file for complete search history.

(56) References Cited

U.S. PATENT DOCUMENTS

| | | | | |
|---|---|---|---|---|
| 5,229,311 A | * | 7/1993 | Lai et al. ..................... | 438/143 |
| 6,071,784 A | * | 6/2000 | Mehta et al. ............... | 438/303 |
| 6,774,462 B2 | * | 8/2004 | Tanaka et al. .............. | 257/639 |
| 2003/0183939 A1 | * | 10/2003 | Kakamu et al. ............ | 257/762 |
| 2005/0012122 A1 | * | 1/2005 | Kakamu et al. ............ | 257/257 |
| 2005/0020021 A1 | * | 1/2005 | Fujiwara et al. ............ | 438/303 |
| 2005/0112817 A1 | * | 5/2005 | Cheng et al. ............... | 438/219 |

* cited by examiner

*Primary Examiner*—Jerome Jackson
*Assistant Examiner*—Paul Budd
(74) *Attorney, Agent, or Firm*—Okamoto & Benedicto LLP (57) ABSTRACT

In one embodiment, an integrated circuit includes a PMOS transistor having a gate stack comprising a P+ doped gate polysilicon layer and a nitrided gate oxide (NGOX) layer. The NGOX layer may be over a silicon substrate. The integrated circuit further includes an interconnect line formed over the transistor. The interconnect line includes a hydrogen getter material and may comprise a single material or stack of materials. The interconnect line advantageously getters hydrogen (e.g., $H_2$ or $H_2O$) that would otherwise be trapped in the NGOX layer/silicon substrate interface, thereby improving the negative bias temperature instability (NBTI) lifetime of the transistor.

11 Claims, 7 Drawing Sheets

TECHNIQUES FOR IMPROVING NEGATIVE BIAS TEMPERATURE INSTABILITY (NBTI) LIFETIME OF FIELD EFFECT TRANSISTORS

CROSS-REFERENCE TO RELATED APPLICATION

This application claims the benefit of U.S. Provisional Application No. 60/532,135, filed on Dec. 22, 2003, incorporated herein by reference in its entirety.

BACKGROUND OF THE INVENTION

1. Field of the Invention

The present invention relates generally to integrated circuits, and more particularly to integrated circuit fabrication processes and structures.

2. Description of the Background Art

P-channel metal oxide semiconductor (PMOS) field effect transistors (FETs) fabricated using dual doped gate technology and with nitrided gate oxide (NGOX) layers have been found to exhibit negative bias temperature instability (NBTI) after voltage and temperature stressing. This instability gives rise to problems that under negative gate bias voltage, the magnitude of threshold voltage ($V_t$) of the FET increases and drain saturation current ($I_{DSat}$) decreases. This mechanism is known to cause degradation of performance of the PMOS FETs and, in particular, loss of speed over time. In contrast FETs fabricated using single doped gate technology and with pure silicon dioxide ($SiO_2$) gate oxides typically do not exhibit NBTI problems.

SUMMARY

In one embodiment, an integrated circuit includes a PMOS transistor having a gate stack comprising a P+ doped gate polysilicon layer and a nitrided gate oxide (NGOX) layer. The NGOX layer may be over a silicon substrate. The integrated circuit further includes an interconnect line formed over the transistor. The interconnect line includes a hydrogen getter material and may comprise a single material or stack of materials. The interconnect line advantageously getters hydrogen (e.g., $H_2$ or $H_2O$) that would otherwise be trapped in the NGOX layer/silicon substrate interface, thereby improving the negative bias temperature instability (NBTI) lifetime of the transistor.

These and other features of the present invention will be readily apparent to persons of ordinary skill in the art upon reading the entirety of this disclosure, which includes the accompanying drawings and claims.

DESCRIPTION OF THE DRAWINGS

FIG. 2, which consists of FIGS. 2(a)-2(c), schematically shows side sectional views of interconnect lines formed using a conventional process.

FIG. 3, which consists of FIGS. 3(a)-3(c), schematically shows side sectional views of interconnect lines formed in accordance with an embodiment of the present invention.

The use of the same reference label in different drawings indicates the same or like components. Drawings are not necessarily to scale unless otherwise noted.

DETAILED DESCRIPTION

In the present disclosure, numerous specific details are provided, such as examples of materials, process steps, and structures, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1A:
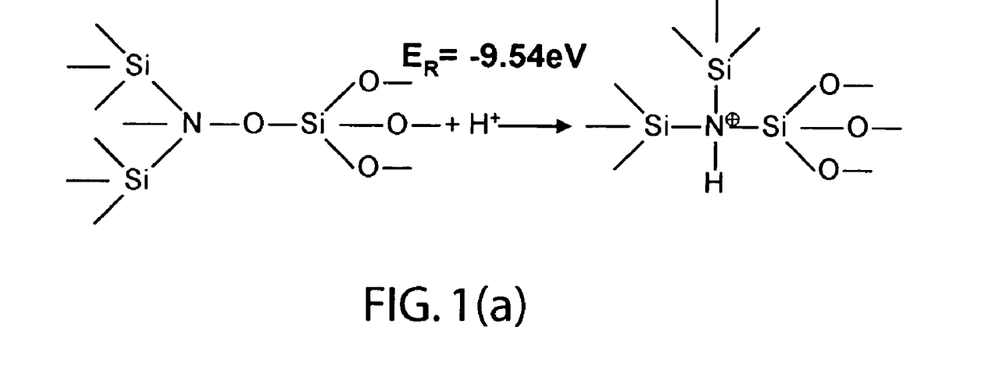
FIGS. 1(a) and 1(b) show equations illustrating a possible explanation behind NBTI lifetime degradation.
Figure 1B:
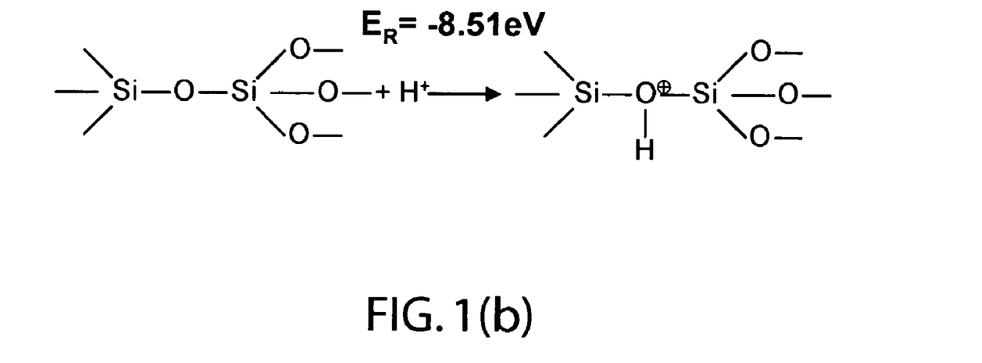

One possible mechanism that gives rise to NBTI problems is an electro-chemical reaction, which may be occurring in the NGOX layer due to tendency of nitrogen-silicon bonds to break and incorporate a hydrogen atom, as illustrated in the equation of FIG. 1(a). In contrast, it is much more difficult to trap hydrogen in the pure $SiO_2$ gate oxide of the prior technology as illustrated in the equation of FIG. 1(b). The result of the reaction expressed in the equation of FIG. 1(a) is a net positive charge in the NGOX layer/silicon substrate interface. This phenomenon increases over time, lowering the capability of the region under the NGOX layer to function as a channel of the PMOS FET. Moreover, the degradation caused by NBTI increases with the strength of the electric field in the NGOX layer. Thus, the NBTI problem becomes worse with each successive generation of PMOS FETs as oxide thickness is aggressively reduced.

Figure 2A:
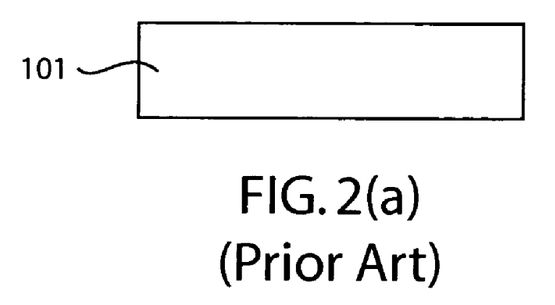
Figure 2B:
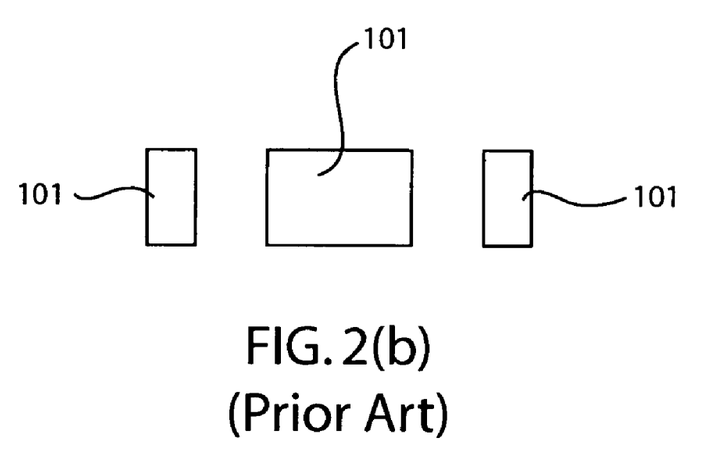
Figure 2C:
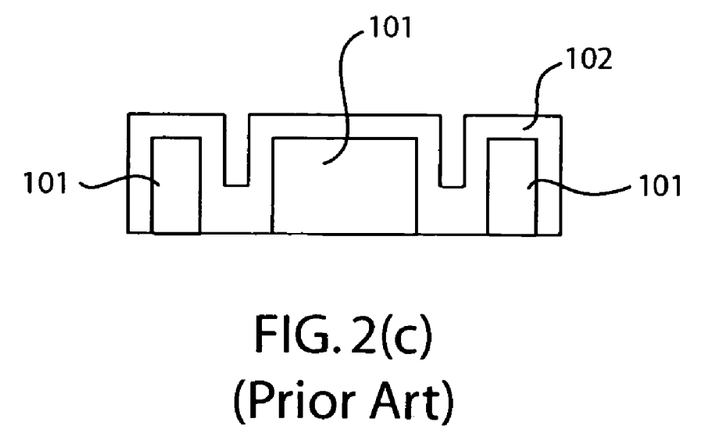

FIG. 2, which consists of FIGS. 2(a)-2(c), schematically shows side sectional views of interconnect lines formed using a conventional process. FIG. 2(a) shows a metal layer 101 that is subsequently processed to form several local interconnect lines. The metal layer 101 comprises titanium nitride (TiN) deposited on a planarized dielectric layer (not shown), which is over a PMOS FET (not shown) having a gate stack comprising a P+ doped gate polysilicon layer and an NGOX layer. In FIG. 2(b), the metal layer 101 is etched to form several local interconnect lines. In FIG. 2(c), a contact etch stop layer 102 is deposited on the local interconnect lines. The contact etch stop layer 102 comprises silicon nitride.

Without being limited by theory, the NBTI threshold voltage (VT) shift problem associated with conventional processes, such as that illustrated in FIG. 2, may be attributable to increased NGOX layer/silicon substrate interface charge due to de-passivation of hydrogen bonded to silicon leaving behind traps, as shown in equations 1-3 below, and additionally re-trapping at the NGOX layer/silicon substrate interface, as illustrated in the equation of FIG. 1(a).

EQ. 1

EQ. 2

EQ. 3

Where "A" in the above equations is water related.

As a result, conventionally formed PMOS transistors that have P+ doped polysilicon gates over NGOX layers may have an NBTI lifetime of about 400 seconds for a 20

Angstrom NGOX layer at accelerated testing conditions (e.g., 50 mV $V_{Tsat}$ shift at VG=−2.4V, test temperature T=125° C.). This corresponds to a lifetime of less than 1 year under normal operating conditions (e.g., $V_G$=1.2V, T=25° C.).

Figure 3A:
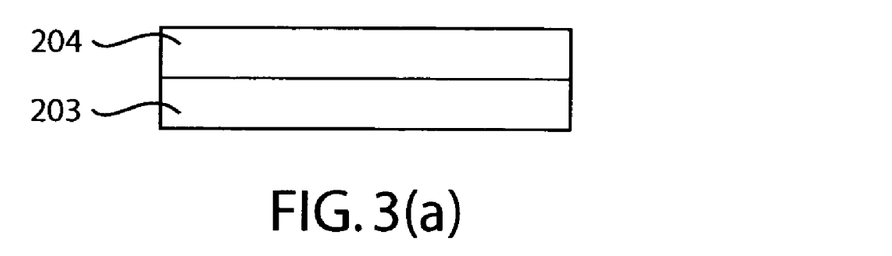
Figure 3B:
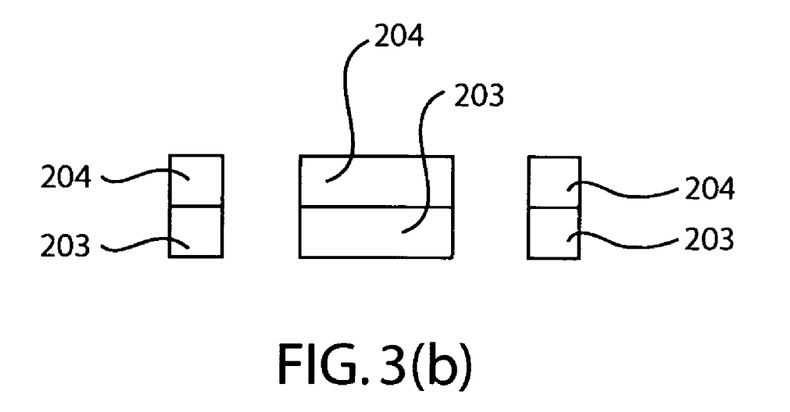
Figure 3C:
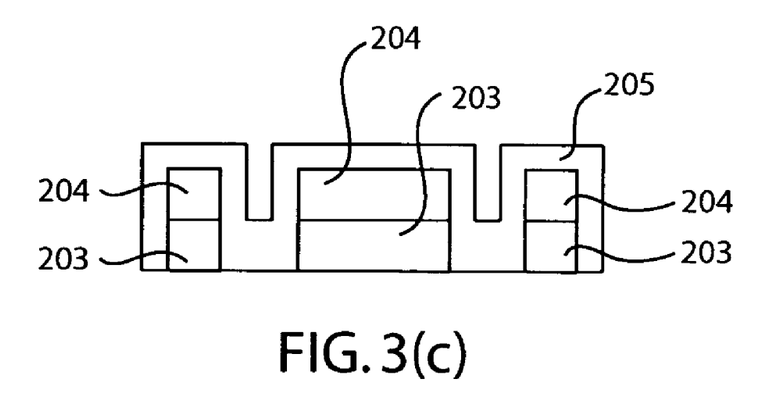

FIG. 3, which consists of FIGS. 3(a)-3(c), schematically shows side sectional views of interconnect lines formed in accordance with an embodiment of the present invention. FIG. 3(a) shows a bimetal layer comprising a getter material 203 and an interconnect material 204. The bimetal layer may be formed over a PMOS transistor having a gate stack comprising a P+ doped polysilicon gate layer and an NGOX layer (e.g., see transistor 450-1 on FIG. 4). The bimetal layer may be formed on a planarized dielectric layer (e.g., see dielectric layer 308 on FIG. 4), which is formed on the PMOS transistor. The getter material 203 may comprise a metal that has hydrogen (H) and water ($H_2O$) gettering properties, such as titanium, for example. The interconnect material 204 may comprise a metal suitable for use in an interconnect line, such as titanium-nitride or tungsten (W), for example. In one embodiment, the bimetal layer is a Ti/TiN stack, with the titanium serving as the getter material. The bimetal layer may also be a Ti/N stack, for example, with the titanium serving as the getter material.

In FIG. 3(b), the bimetal layer is etched to form several interconnect lines comprising the getter material 203 and the interconnect material 204. The interconnect lines formed from the bimetal layer may comprise a local interconnect line, for example. The sample of FIG. 3(b) may be annealed at a temperature range of about 400-500° C., preferably at about 450° C. for about 30 minutes in a neutral hydrogen environment.

In FIG. 3(c), a contact etch stop layer 205 is deposited over the interconnect lines formed from the bimetal layer. The contact etch stop layer 205 may comprise silicon nitride, for example. As its name implies, the contact etch stop layer 205 serves as an etch stop for a subsequent contact etch step through a dielectric (not shown) subsequently formed over the interconnect lines. The contact etch stop layer 205 also serves as a diffusion barrier to prevent hydrogen and water from diffusing into the NGOX layer.

The use of a material with hydrogen and water gettering properties, such as a single layer of pure titanium or bimetal layer comprising titanium, in a first level of metal interconnect advantageously reduces, and in some cases eliminates, the introduction of charges contributed from hydrogen as illustrated by equations 1 to 3 above. Titanium is a preferred getter material because it is capable of gettering all forms of hydrogen or hydrogen related species including neutral and $H^+$.

In another embodiment, de-passivated Si dangling bonds resulting from the loss of hydrogen in the NGOX layer/silicon substrate interface may be back-filled with neutral $H_2$ or deuterium ($D_2$) during the anneal step described above in connection with FIG. 3(b) for improved mobility of the charge carriers.

In yet another embodiment, a metal layer comprising a getter material may be encapsulated with a hydrogen diffusion barrier, such as silicon nitride, as described above in connection with FIG. 3(c). In one version of this embodiment, the silicon nitride is deposited using plasma enhanced chemical vapor deposition (PECVD).

In a preferred embodiment, a method of improving NBTI lifetime in integrated circuits includes the steps of: (i) forming a bimetal layer having titanium (e.g., about 550 Angstroms thick) as a getter material and titanium-nitride (e.g., about 350 Angstroms thick) as an interconnect material; (ii) performing a hydrogen anneal after the bimetal layer has been etched into local interconnect lines; and (iii) depositing a silicon nitride layer (e.g., about 1100 Angstroms thick) by PECVD to encapsulate the local interconnect lines. It has been found that the absence of $H^+$ and $H_2O$ in the NGOX layer/silicon substrate interface achieved using a process in accordance with an embodiment of the present invention increases the NBTI lifetime of a PMOS FET by about 100 times over that of prior art processes.

Figure 4:
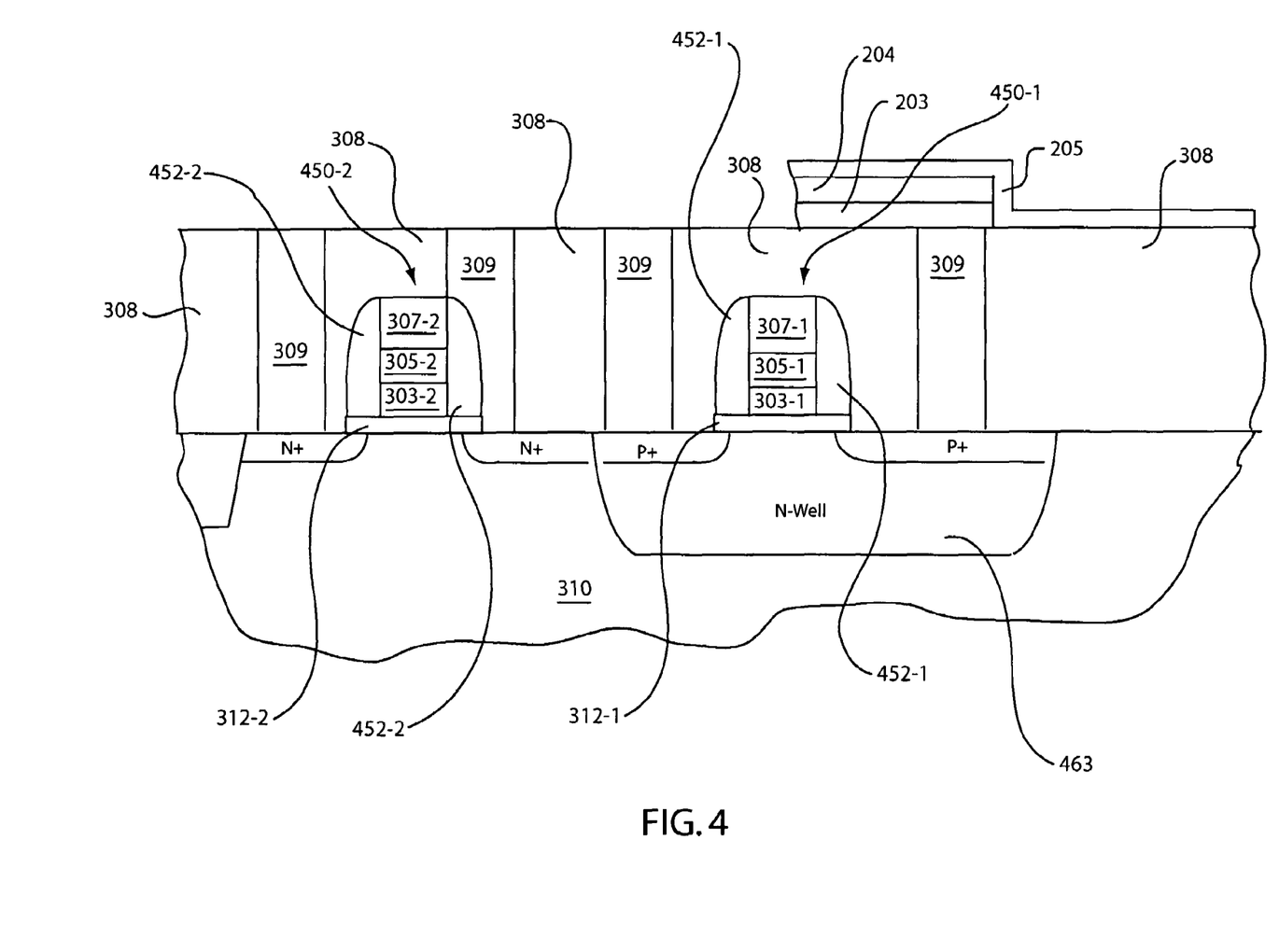
FIGS. 4 and 5 schematically show side sectional views of portions of integrated circuits fabricated in accordance with embodiments of the present invention.

FIG. 4 schematically shows a side sectional view of a portion of an integrated circuit fabricated in accordance with an embodiment of the present invention. In the example of FIG. 4, complementary metal oxide semiconductor (CMOS) FETs 450-1 and 450-2 are fabricated on a substrate 310, which may be a P-type silicon substrate, using dual doped gate technology. A PMOS FET 450-1 is formed on an N-well 463, while its complementary NMOS FET 450-2 is formed as a native transistor or on a P-well. The PMOS FET 450-1 and NMOS FET 450-2 include P+ and N+, respectively, sources and drains, which are not labeled to simplify the figure. Contact structures 309 are formed through a pre-metal dielectric (PMD) layer 308 to provide electrical connections to source and drains. The pre-metal dielectric layer 308 is so named because it comprises a dielectric material suitable for use as a dielectric layer before the first metal layer. In one embodiment, the pre-metal dielectric layer 308 comprises phosphorous silica glass (PSG) deposited to a thickness of about 8000 Angstroms by high density plasma chemical vapor deposition (HDP-CVD).

In the example of FIG. 4, each FET 450 includes a gate stack comprising a gate polysilicon layer 303, a tungsten layer 305, a silicon nitride layer 307, an NGOX layer 312, and silicon nitride spacers 452. In FIG. 4, a "−1" indicates a component of FET 450-1, while a "−2" indicates a component of FET 450-2. An NGOX layer 312 serves as a gate dielectric of an FET 450. An NGOX layer 312 may be formed by growing silicon dioxide over substrate 310 and then annealing the silicon dioxide in an environment including nitrogen (e.g., in an NO environment). In one embodiment, an NGOX layer 312 is about 20 to 22 Angstroms thick. An NGOX layer 312 serves as the gate oxide or gate dielectric of a FET 450.

Complementary FETs 450-1 and 450-2 are fabricated using dual doped gate technology in that their respective gate polysilicon layers 303 have different dopants. In the example of FIG. 4, the gate polysilicon layer 303-1 is doped with a P+ dopant (e.g., boron or boron difluoride), while the gate polysilicon layer 303-2 is doped with an N+ dopant (e.g., arsenic). In contrast, FETs fabricated using conventional single doped technology typically have an N+ doped gate polysilicon layer in both the PMOS and NMOS complementary transistors.

In the FET 450-1, the NGOX layer 312-1 helps prevent the P+ dopant (boron in this, example) of gate polysilicon layer 303-1 from diffusing into the channel region underneath the NGOX layer 312-1. Unfortunately, the NGOX layer 312-1/silicon substrate 310 interface has a tendency to trap hydrogen, which may result in decreased NBTI lifetime as previously described.

In the example of FIG. 4, a layer of getter material 203 is formed as the first metal layer above the FET 450-1. This advantageously allows the getter material 203 to getter hydrogen and water that would be otherwise trapped in the NGOX layer/silicon substrate interface. In one embodiment, the getter material comprises titanium deposited to a thickness of about 500 to 550 Angstroms by physical vapor deposition (PVD). Overlying the getter material 203 is a layer of interconnect material 204. In one embodiment, the interconnect material comprises titanium-nitride deposited to a thickness of about 350 Angstroms by PVD.

The bimetal layer comprising the getter material 203 and the interconnect material 204 may be encapsulated by a diffusion barrier 205. The diffusion barrier 205 prevents charged $H_2$ and $H_2O$ from diffusing into an NGOX 312 layer and may also serve as an etch stop. In one embodiment, the diffusion barrier 205 comprises silicon nitride deposited to a thickness of about 1100 Angstroms by PECVD. The diffusion barrier 205 of silicon nitride may also be deposited by low pressure chemical vapor deposition (LPCVD) using bis(tertiary-butylamino)silane (BTBAS) and ammonia.

Figure 5:
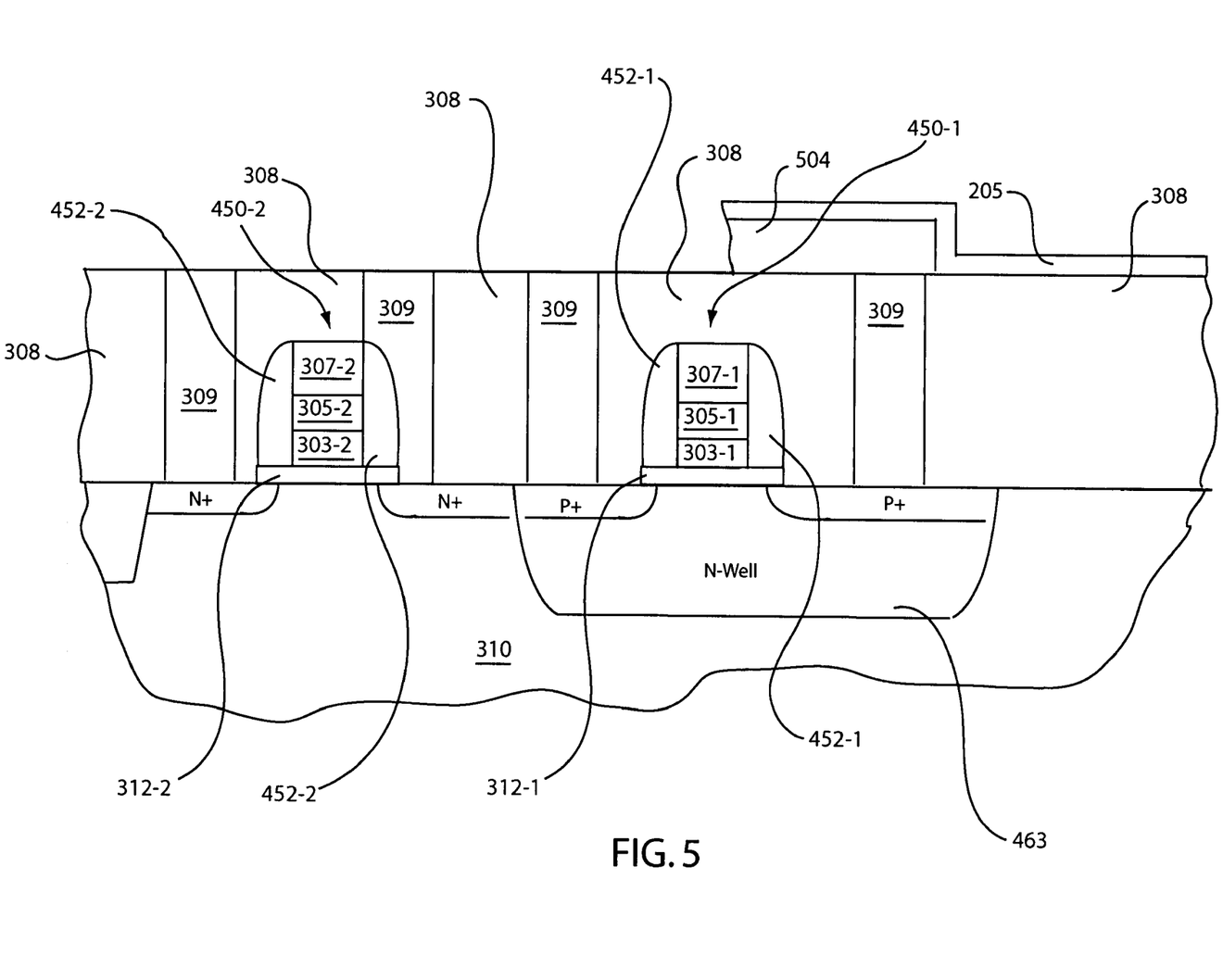

FIG. 5 schematically shows a side sectional view of a portion of an integrated circuit fabricated in accordance with an embodiment of the present invention. The example of FIG. 5 is similar to that of FIG. 4 except for the use of a single metal layer 504 instead of a bimetal layer comprising a getter material and an interconnect material. In the example of FIG. 5, the metal layer 504 is a first metal layer above the FET 450-1 and serves as a local interconnect line and a hydrogen getter material. The metal layer 504 may comprise tungsten deposited to a thickness of about 500 to 2000 Angstroms by PVD, for example. The metal layer 504 may be encapsulated by a diffusion barrier 205 as in FIG. 4. A metal layer 504 of tungsten may be formed using either a subtractive process or a damascene process without detracting from the merits of the present invention.

Figure 6:
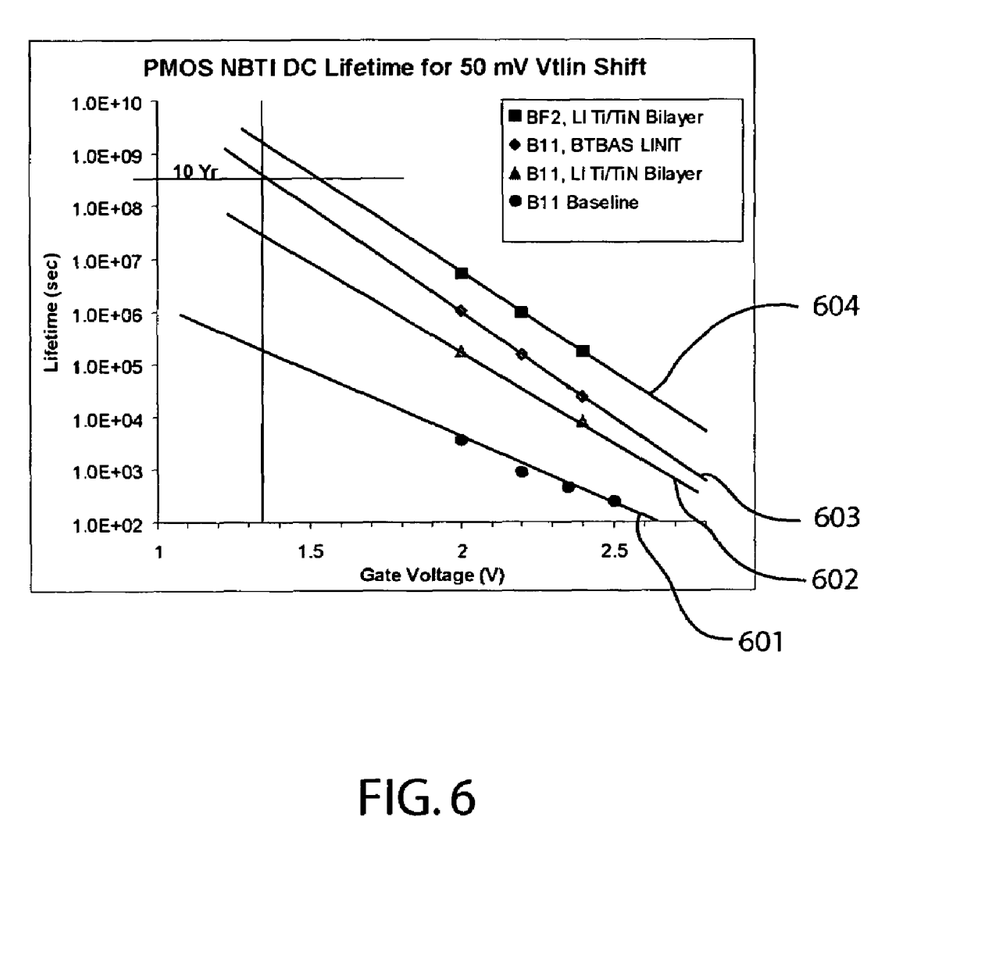
FIG. 6 shows plots illustrating the improvement in NBTI lifetime of PMOS FETs fabricated in accordance with embodiments of the present invention.

FIG. 6 shows plots illustrating the improvement in NBTI lifetime of PMOS FETs fabricated in accordance with embodiments of the present invention. The plots of FIG. 6 are for PMOS transistors having a gate stack comprising P+ doped gate polysilicon layers and NGOX layers.

The transistor of plot 601, which serves as a baseline for comparison purposes, does not employ a first level metal interconnect layer with a getter material and does not employ a hydrogen diffusion barrier. The polysilicon gate dopant of the transistor of plot 601 is pure boron.

Plot 602 is for a transistor having pure boron as a polysilicon gate dopant and a first level metal interconnect layer comprising a bimetal layer of Ti/TiN, with the titanium serving as the getter material and the titanium-nitride formed over the titanium. The hydrogen diffusion barrier over the bimetal layer of the transistor of plot 602 comprises silicon nitride deposited by PECVD.

Plot 603 is for a transistor having pure boron as a polysilicon gate dopant and a first level metal interconnect layer comprising a bimetal layer of Ti/TiN, with the titanium serving as the getter material and the titanium-nitride formed over the titanium. The hydrogen diffusion barrier layer over the bimetal layer of the transistor of plot 603 comprises silicon nitride deposited by LPCVD using BTBAS and ammonia.

Plot 604 is for a transistor having boron difluoride ($BF_2$) as a polysilicon gate dopant and a first level metal interconnect layer comprising a bimetal layer of Ti/TiN, with the titanium serving as the getter material and the titanium-nitride formed over the titanium. The hydrogen diffusion barrier over the bimetal layer of the transistor of plot 604 comprises silicon nitride deposited by PECVD. As is evident from plots 601-604, using boron difluoride as polysilicon gate dopant together with a first level metal interconnect layer that includes a hydrogen getter material may yield the best NBTI lifetime among transistors in the test.

Figure 7:
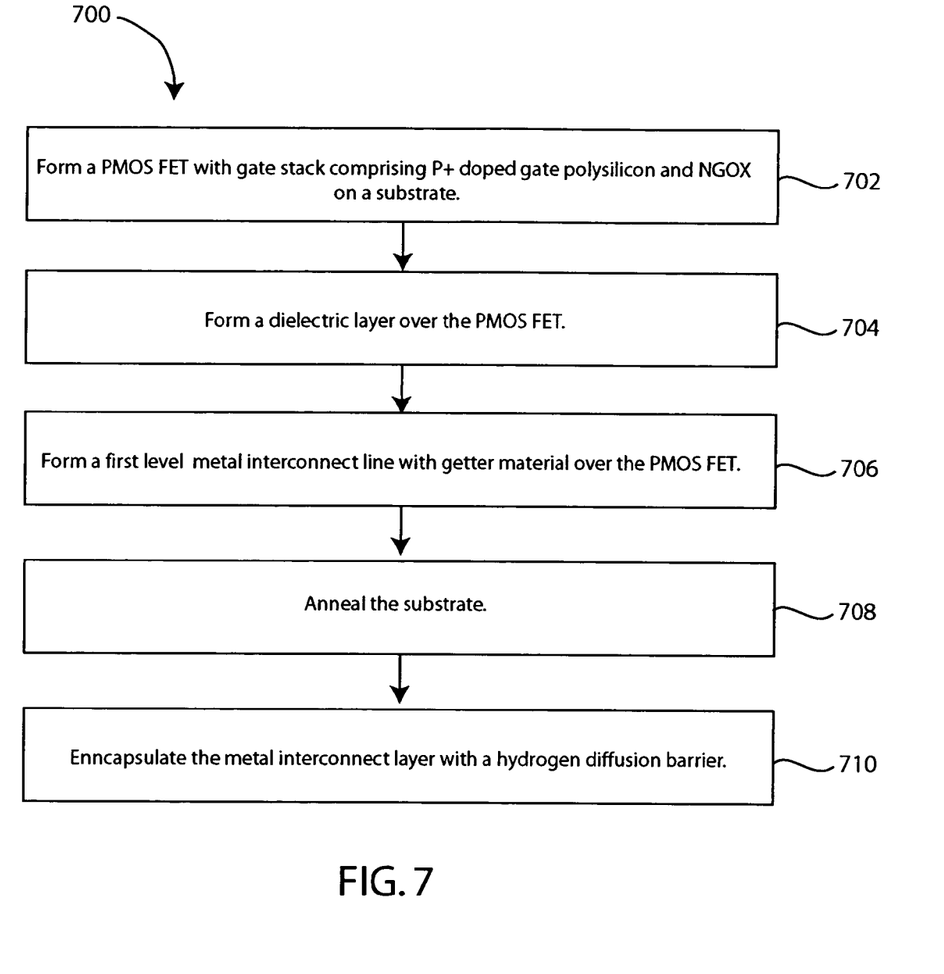
FIG. 7 shows a flow diagram of a method of fabricating an integrated circuit in accordance with an embodiment of the present invention.

Referring now to FIG. 7, there is shown a flow diagram of a method 700 of fabricating an integrated circuit in accordance with an embodiment of the present invention. In one embodiment, the integrated circuit includes a PMOS FET having a complementary NMOS FET fabricated using dual doped gate technology.

In step 702, a PMOS FET is formed on a silicon substrate. The PMOS FET includes a gate stack comprising a P+ doped polysilicon gate on an NGOX layer.

In step 704, a pre-metal dielectric layer is formed over the PMOS FET. The pre-metal dielectric layer may then be planarized.

In step 706, a first level metal interconnect line that includes a getter material is formed over the pre-metal dielectric layer. The getter material may comprise titanium or other material that can getter hydrogen (e.g., $H_2$ or $H_2O$). As its name implies, the first level metal interconnect line may be on a first metal level above the PMOS FET so as to fully utilize the getter properties of the getter material. The first level metal interconnect line may comprise a single material or a stack of materials.

In step 708, the substrate on which the PMOS FET is being fabricated is optionally annealed in a neutral $H_2$ or deuterium ($D_2$) environment to back-fill de-passivated silicon dangling bonds.

In step 710, the first level metal interconnect line is encapsulated with a hydrogen diffusion barrier layer to prevent hydrogen (e.g., $H_2$ or $H_2O$) from diffusing into the NGOX layer.

Techniques for improving the NBTI lifetime of field effect transistors have been disclosed. While specific embodiments have been provided, it is to be understood that these embodiments are for illustration purposes and not limiting. Many additional embodiments will be apparent to persons of ordinary skill in the art reading this disclosure.

What is claimed is:

1. A method of fabricating an integrated circuit, the method comprising:
    forming a PMOS transistor, the PMOS transistor including a gate stack that includes a P+ doped gate polysilicon layer formed over a nitrided gate oxide layer, the nitrided gate oxide layer of the PMOS transistor being over a substrate;
    forming an NMOS transistor that is complementary to the PMOS transistor, the NMOS transistor including an N+ doped gate polysilicon layer formed over a nitrided gate oxide layer;
    forming a dielectric over the PMOS transistor and the NMOS transistor;
    forming a first level metal interconnect line over the dielectric, the first level metal interconnect line comprising a hydrogen getter material;
    annealing the substrate after forming the first level metal interconnect line over the dielectric but prior to encapsulating the first level metal interconnect line with a hydrogen diffusion barrier layer; and
    forming the hydrogen diffusion barrier layer over the first level metal interconnect to prevent hydrogen from diffusing into the nitrided gate oxide layer.

2. The method of claim 1 wherein the getter material comprises titanium.

3. The method of claim 1 wherein the getter material comprises tungsten.

4. The method of claim 1 wherein the getter material is a getter material for water.

5. The method of claim 1 wherein the first level metal interconnect line includes an interconnect material formed over the getter material.

6. The method of claim 1 wherein the substrate is annealed in a hydrogen containing environment.

7. The method of claim 1 wherein the substrate is annealed in a deuterium containing environment.

8. The method of claim 1 wherein the hydrogen diffusion barrier layer comprises silicon nitride.

9. A method of fabricating an integrated circuit, the method comprising:
- forming a PMOS transistor, the PMOS transistor including a nitrided gate oxide layer over a substrate and a P+ doped gate polysilicon layer over the nitrided gate oxide layer;
- forming a pre-metal dielectric layer over the PMOS transistor;
- forming a local interconnect line over the pre-metal dielectric layer, the local interconnect line comprising a hydrogen getter material;
- annealing the substrate after forming the local interconnect line over the pre-metal dielectric layer but prior to encapsulating the local interconnect line with a hydrogen diffusion barrier layer; and
- forming the hydrogen diffusion barrier layer over the local interconnect line to prevent hydrogen from diffusing into the nitrided gate oxide layer.

10. The method of claim 9 further comprising:

prior to forming the pre-metal dielectric layer over the PMOS transistor, forming an NMOS transistor that is complementary to the PMOS transistor, the NMOS transistor including an N+ doped polysilicon gate.

11. The method of claim 9 wherein the local interconnect line comprises a bimetal layer of titanium and titanium-nitride.

* * * * *